(12) United States Patent
Liu et al.

(10) Patent No.: US 10,615,232 B2
(45) Date of Patent: Apr. 7, 2020

(54) DISPLAY DEVICE, ELECTRONIC DEVICE, AND LIGHT EMITTING UNIT DAMAGE PROCESSING METHOD AND DEVICE

(71) Applicant: GoerTek Technology Co., Ltd., Shandong Province (CN)

(72) Inventors: Xun Liu, Shandong Province (CN); Maoqing Tang, Shandong Province (CN)

(73) Assignee: GoerTek Technology Co., Ltd., Shandong Province (CN)

( * ) Notice: Subject to any disclaimer, the term of this patent is extended or adjusted under 35 U.S.C. 154(b) by 0 days.

(21) Appl. No.: 16/322,013

(22) PCT Filed: Dec. 31, 2016

(86) PCT No.: PCT/CN2016/114001
§ 371 (c)(1),
(2) Date: Jan. 30, 2019

(87) PCT Pub. No.: WO2018/053972
PCT Pub. Date: Mar. 29, 2018

(65) Prior Publication Data
US 2019/0189716 A1 Jun. 20, 2019

(30) Foreign Application Priority Data
Sep. 23, 2016 (CN) .......................... 2016 1 0847791

(51) Int. Cl.
*H01L 27/32* (2006.01)
*H01L 51/52* (2006.01)
*H01L 51/00* (2006.01)

(52) U.S. Cl.
CPC ...... *H01L 27/3248* (2013.01); *H01L 27/3241* (2013.01); *H01L 51/0031* (2013.01); *H01L 51/5275* (2013.01); *H01L 2251/568* (2013.01)

(58) Field of Classification Search
None
See application file for complete search history.

(56) References Cited

U.S. PATENT DOCUMENTS

2011/0130981 A1    6/2011    Chaji et al.
2016/0126501 A1    5/2016    Kim et al.
(Continued)

FOREIGN PATENT DOCUMENTS

CN    1099150 A       2/1995
CN    101994930 A     3/2011
(Continued)

OTHER PUBLICATIONS

International Bureau of WIPO, International Search Report and Written Opinion in Application No. PCT/CN2016/114001, dated Jul. 10, 2019.
(Continued)

*Primary Examiner* — Telly D Green
(74) *Attorney, Agent, or Firm* — LKGlobal | Lorenz & Kopf, LLP

(57) ABSTRACT

A display apparatus, an electronic apparatus (4000), a method for treating failure of a light-emitting unit and an apparatus (7000) for treating failure of a light-emitting unit. The display apparatus comprises: a light-emitting device (10), comprising a plurality of light-emitting units (11) that form a matrix arrangement; and a light-transmitting device (20) provided over the light-emitting device (10), wherein the light-transmitting device (20) comprises a plurality of light-transmitting units (21) that form a matrix arrangement and are provided corresponding to the light-emitting units (11), each of the light-transmitting units (21) is of a rectangle shape, and comprises a light-transmitting opening (212) that is formed by enclosing of side walls (213) that have an independent inflating passageway (215), and the side walls (Continued)

(213) are configured to have a light refraction passageway (214).

12 Claims, 4 Drawing Sheets

(56) References Cited

U.S. PATENT DOCUMENTS

| | | | |
|---|---|---|---|
| 2016/0189593 A1 | 6/2016 | Lee et al. | |
| 2017/0033168 A1 | 2/2017 | Jeong et al. | |

FOREIGN PATENT DOCUMENTS

| | | | |
|---|---|---|---|
| CN | 102725786 | A | 10/2012 |
| CN | 102749740 | A | 10/2012 |
| CN | 104217684 | A | 12/2014 |
| CN | 104659055 | A | 5/2015 |
| CN | 205092244 | U | 3/2016 |
| CN | 105611196 | A | 5/2016 |
| CN | 105741734 | A | 7/2016 |
| JP | 2003045652 | A | 2/2003 |
| JP | 2003051383 | A | 2/2003 |

OTHER PUBLICATIONS

National Intellectual Property Administration of the Peoples Republic of China, First Office Action in Application No. 2018073002009870, dated Aug. 2, 2018.

DISPLAY DEVICE, ELECTRONIC DEVICE, AND LIGHT EMITTING UNIT DAMAGE PROCESSING METHOD AND DEVICE

CROSS REFERENCE TO RELATED APPLICATIONS

This application is a U.S. National Stage entry under 35 U.S.C. § 371 based on International Application No. PCT/CN2016/114001, filed on Dec. 31, 2016, which was published under PCT Article 21(2) and which claims priority to Chinese Patent Application No. 201610847791.0, filed on Sep. 23, 2016. These priority applications are hereby incorporated herein in their entirety by reference.

TECHNICAL FIELD

This application pertains to the technical field of optical display, and particularly relates to a display apparatus, an electronic apparatus, and a method and apparatus for treating failure of a light-emitting unit.

BACKGROUND

OLED (Organic Light-Emitting Diode) is also referred to as organic electric laser display or Organic Electroluminesence Display (OED). OLED display technique has the advantages such as self-illumination, wide visual angle, nearly infinitely high contrast, relatively low power consumption and ultra-high response speed, and is extensively applied in electronic apparatus such as mobile phones, digital cameras, DVD machines, personal digital assistants (PDA), notebook computers, car audios and television sets. Especially, as a human-machine interaction interface, OLED display screens in recent years are also extensively applied to wearable electronic apparatus such as smart watches and smart bracelets.

However, regarding the current OLED modules, as limited by the manufacturing process and size, the product yield of OLED display screens is always poor. Especially, the problem of dead pixels of OLED display screens greatly limits the production and using of OLED. Both of manufacturing failure of OLED unit and excitation of the complete apparatus in moist and hot surroundings may cause the problem of dead pixels of OLED display screens. Moreover, in the prior art, when an OLED display screen has a dead pixel, usually it is required to dismantle the OLED display screen to repair or replace the OLED display screen, which adversely affects the product yield and the user experience of the display apparatus.

Therefore, the inventors consider that, it is necessary to overcome the above problems in the prior art. In addition, other objects, desirable features and characteristics will become apparent from the subsequent summary and detailed description, and the appended claims, taken in conjunction with the accompanying drawings and this background.

SUMMARY

The present invention will hereinafter be described in conjunction with the following drawing figures, wherein like numerals denote like elements, and, the inventors of the present disclosure have found that, in the prior art, there has not been a technical solution that can, when a light-emitting unit of a display apparatus has failed in manufacturing or using process, treat the failed light-emitting unit without dismantling the display apparatus.

An object to the present disclosure is to provide a new technical solution for treating failure of a light-emitting unit.

According to the first aspect of the present disclosure, there is provided a display apparatus, comprising:

a light-emitting device, wherein the light-emitting device comprises a plurality of light-emitting units that form a matrix arrangement;

and a light-transmitting device provided over the light-emitting device, wherein the light-transmitting device comprises a plurality of light-transmitting units that form a matrix arrangement and are provided corresponding to the light-emitting units, the light-transmitting unit is of a rectangle shape, and comprises a light-transmitting opening that is formed by enclosing of side walls that have an independent inflating passageway, and the side walls are configured to have a light refraction passageway.

In some embodiments, the light-emitting units are OLED pixel dots.

In some embodiments, each of the side walls is a gas tank provided with at least one inflating opening.

In some embodiments, a cross section of the side walls is of a trapezoid or arch shape.

In some embodiments, the light-transmitting unit is a light guide film that covers the light-emitting unit.

According to the second aspect of the present disclosure, there is provided an electronic apparatus, comprising the display apparatus provided by the first aspect of the present disclosure.

According to the third aspect of the present disclosure, there is provided a method for treating failure of a light-emitting unit, applied to the display apparatus provided by the first aspect of the present disclosure, comprising:

when it is determined that a first light-emitting unit of the display apparatus has failed, inflating a high-refractive-index gas into at least one of side walls of a first light-transmitting unit provided corresponding to the first light-emitting unit to configure a light refraction passageway of the side walls, so that a light emitted by a second light-emitting unit that neighbors the first light-emitting unit and normally emits light passes through the light refraction passageway, is refracted, and emits out from an area corresponding to the first light-emitting unit in a direction perpendicular to the first light-emitting unit; and when it is detected that a light output amount of the first light-emitting unit reaches a normal threshold, stopping inflating the high-refractive-index gas into the side walls, wherein the normal threshold is determined according to a light output amount of the second light-emitting unit.

In some embodiments, the method for treating failure of a light-emitting unit comprises: a step of determining the failure of the first light-emitting unit by acquiring a light output amount of each of the light-emitting units of the display apparatus.

According to the fourth aspect of the present disclosure, there is provided an apparatus for treating failure of a light-emitting unit, comprising:

a light-emitting compensating unit, for, when it is determined that a first light-emitting unit of the display apparatus has failed, inflating a high-refractive-index gas into at least one of side walls of a first light-transmitting unit provided corresponding to the first light-emitting unit to configure a light refraction passageway of the side walls, so that a light emitted by a second light-emitting unit that neighbors the first light-emitting unit and normally emits light passes through the light refraction passageway, is refracted, and emits out from an area corresponding to the first light-emitting unit in a direction perpendicular to the first light-emitting unit; and a compensation controlling unit, for, when it is detected that a light output amount of the first light-emitting unit reaches a normal threshold, stopping inflating the high-refractive-index gas into the side walls, wherein the normal threshold is determined according to a light output amount of the second light-emitting unit.

In some embodiments, the apparatus for treating failure of a light-emitting unit further comprises:

a failure determining unit, for determining the failure of the first light-emitting unit by acquiring a light output amount of each of the light-emitting units of the display apparatus.

Other features and the advantages of the present disclosure will become apparent from the following detailed description of the exemplary embodiments of the present disclosure in conjunction with the accompanying drawings.

BRIEF DESCRIPTION OF DRAWINGS

The accompanying drawings, which are incorporated into and constitute part of the specification, illustrate the embodiments of the present disclosure and, together with the description thereof, serve to explain the principle of the present disclosure.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description.

Here, various exemplary embodiments of the present disclosure will be described in detail with reference to the drawings. It should be noted that, unless specified otherwise, the arrangements of the members and steps, and the mathematical formulas and numerical values described in these embodiments do not restrict the scope of the present disclosure.

The following description for at least one exemplary embodiment is actually descriptive only, and should not be intended to limit the present disclosure and any application or use thereof.

The techniques, methods and devices well known to a person skilled in the art may not be discussed in detail. However, where applicable, such techniques, methods and devices should be deemed as part of the description.

Any specific value in all of the examples shown and discussed herein should be interpreted as illustrative only rather than restrictive. Therefore, other examples of the exemplary embodiments may include different values.

It should be noted that, similar reference numbers and letters in the following drawings represent similar items. Therefore, once defined in one drawing, an item is not required to be further discussed in the following drawings.

The First Embodiment

Figure 1:
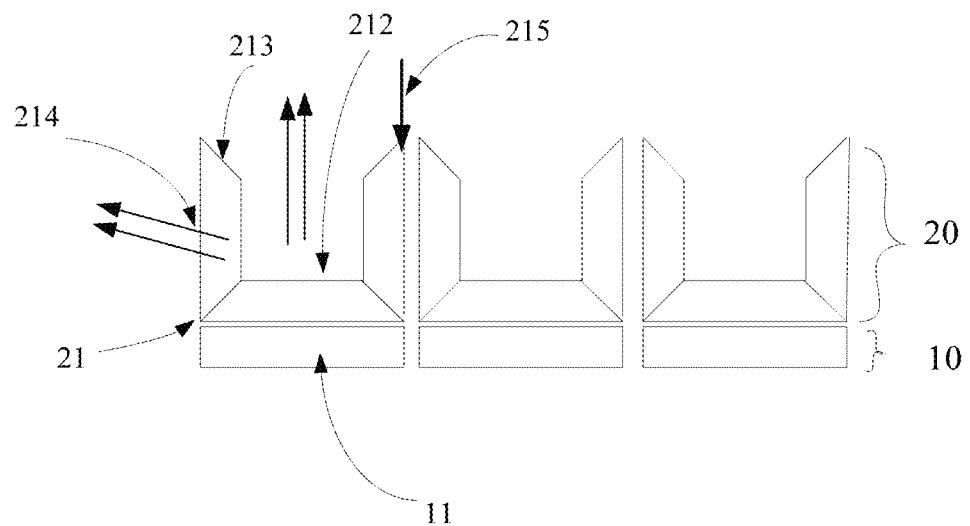
FIG. 1 shows a schematic sectional view of a display apparatus of the first embodiment of the present disclosure.

The present embodiment provides a display apparatus, as shown in FIG. 1, comprising: a light-emitting device 10, wherein the light-emitting device 10 comprises a plurality of light-emitting units 11 that form a matrix arrangement; and a light-transmitting device 20 provided over the light-emitting device 10, wherein the light-transmitting device 20 comprises a plurality of light-transmitting units 21 that form a matrix arrangement and are provided corresponding to the light-emitting units 11, the light-transmitting unit 21 is of a rectangle shape, and comprises a light-transmitting opening 212 that is formed by enclosing of the side walls 213 that have an independent inflating passageway 215, and the side walls 213 are configured to have a light refraction passageway 214.

In the present embodiment, the light-emitting device 10 comprises a plurality of light-emitting units 11 that form a matrix arrangement, and each of the light-emitting units 11 can emit light, so that the brightness of the light-emitting device 11 can satisfy the display demand of the display apparatus of the present embodiment. Particularly, the light-emitting unit 11 may be an OLED pixel dot. OLED is organic light-emitting diode, and has the function of self-illumination. Correspondingly, the display apparatus provided in the present embodiment may be an OLED display screen.

Figure 2:
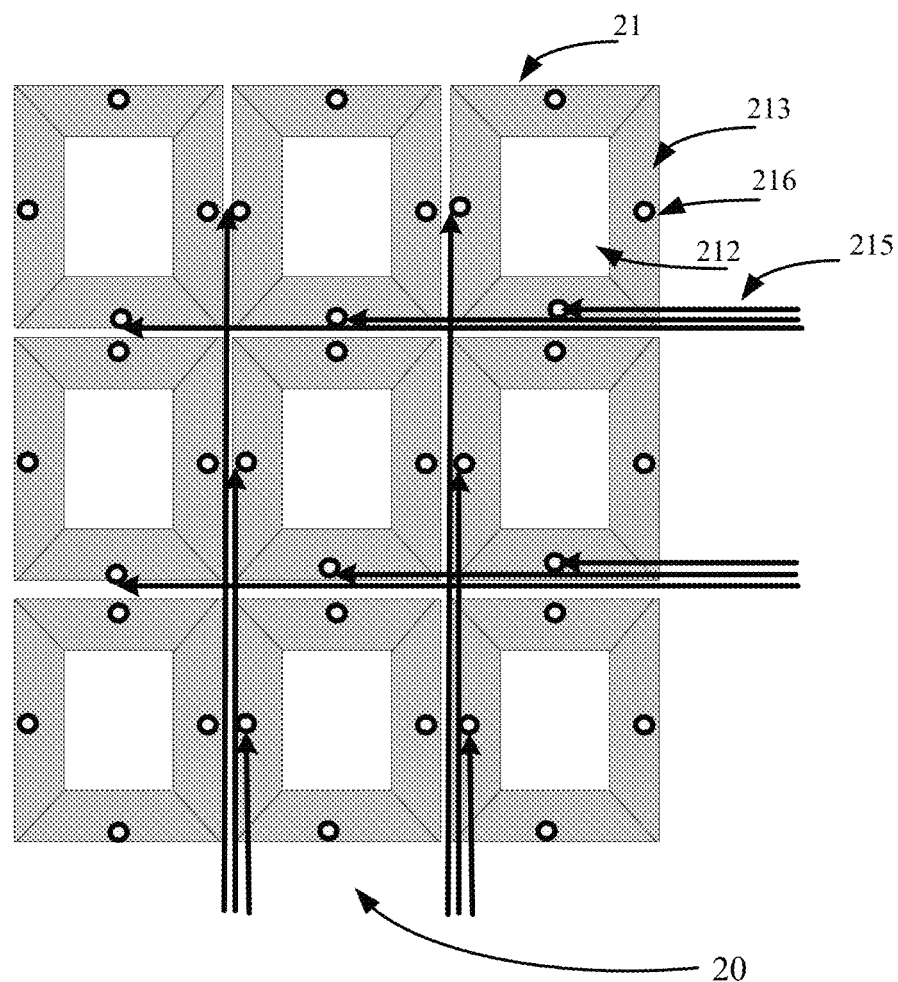
FIG. 2 shows a schematic structural diagram of light-transmitting devices of the first embodiment of the present disclosure.

In the present embodiment, the light-transmitting device 20 is provided over the light-emitting device 10, and the light-transmitting device comprises a plurality of light-transmitting units 21 that form a matrix arrangement and are provided corresponding to the light-emitting units 11, which particularly may be as shown in FIG. 2. In that, the size of the light-transmitting unit 21 may be adapted according to the size of the light-emitting unit 11, so that each of the light-emitting units 11 independently corresponds to one of the light-transmitting units 21. For example, the size of the light-transmitting unit 21 is the same as the size of the light-emitting unit 11. More particularly, when the light-emitting unit 11 is an OLED pixel dot, the size of the light-transmitting unit 21 is the same as the size of the pixel dot.

Furthermore, the light-transmitting unit 21 is of a rectangle shape, and has a light-transmitting opening 212 that is formed by enclosing of the side walls 213 that have an independent inflating passageway 215, and the side walls 213 are configured to have a light refraction passageway 214. As shown in FIG. 2, the light-transmitting unit 21 has four side walls 213, and in an example, the side walls 213 may be a gas tank provided with at least one inflating opening 216. A gas may enter from an external inlet of the display apparatus, flow in via gaps between the light-transmitting units 21 (corresponding to the gaps between the light-emitting units 11 provided under the light-transmitting units 21), and flow into the gas tank via the inflating opening 216, to form a inflating passageway 215. As shown in FIG. 2, merely one gas tank that forms the side walls 213 is filled with gas via the inflating passageway 215, so that the side walls 213 have an independent inflating passageway. Furthermore, in an example, the inflating opening 216 of the gas tank may be controlled to open or close, so each of the inflating passageways 215 can sealedly store a high-refractive-index gas, for example an inert gas, and when the inflating opening 216 is controlled to open, the inert gas can flow in the corresponding gas tank.

Figure 3:
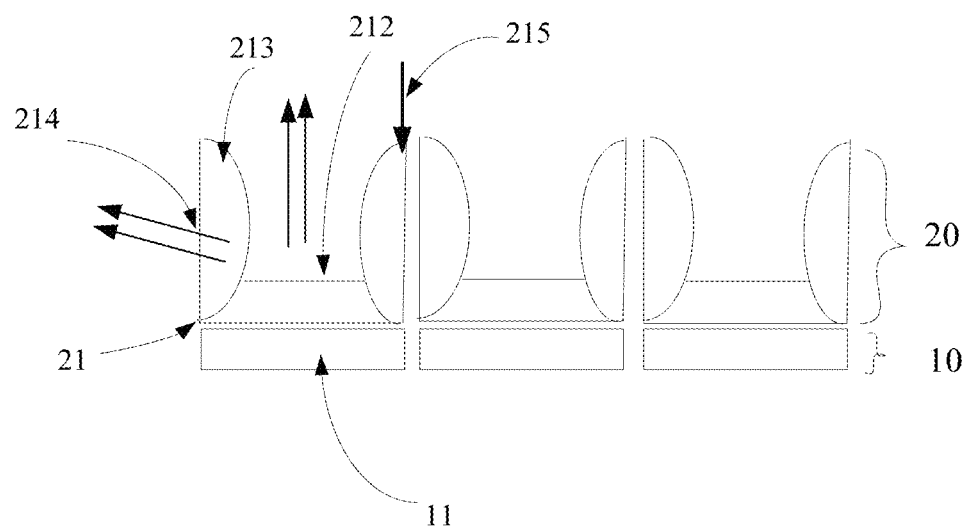
FIG. 3 shows another schematic sectional view of a display apparatus of the first embodiment of the present disclosure.

In addition, the side walls 213 are configured to have a light refraction passageway 214, and in an example, a cross section of the side walls 213 may be of a trapezoid (as shown in FIG. 1) or arch shape (as shown in FIG. 3), so that the light ray that enters the side walls 213 can refract, change the optical propagation direction, and emit out, to have the light refraction passageway 214. Moreover, the side walls 213 may also be manufactured by using a high-light-transmittance material such as a light guide film, so that the light ray that passes through the light refraction passageway 214 has reduced loss. For example, each of the side walls 213 may be a trapezoid gas tank that is formed by the light guide film.

In addition, the light-transmitting units 21 have a light-transmitting opening 212 that is formed by enclosing of four side walls 213. The light emitted by the light-emitting unit 11 provided correspondingly under the light-transmitting units 21 may emit out via the light-transmitting opening 212 without influencing the light output amount of the light-emitting units 11. Particularly, the light-transmitting opening 212 may be a hollow part that is formed by enclosing of four side walls 213, and may also be a light-transmitting layer manufactured by using a high-light-transmittance material; for example, the light-transmitting opening 212 may also be a light guide film. Furthermore, the area of the light-transmitting opening 212 may be set according to the area of the light-emitting units 11, and in an example, the area of the light-transmitting opening 212 is 80% of the area of the light-emitting units 11.

In the present embodiment, the light-transmitting units 21 may also be integrally molded by using a high-light-transmittance material. For example, the light-transmitting units 21 may be a light guide film that covers the light-emitting units 11.

The display apparatus provided in the present embodiment has been described above by referring to FIGS. 1, 2 and 3. The display apparatus comprises a light-emitting device and a light-transmitting device: wherein the light-emitting device comprises a plurality of light-emitting units that form a matrix arrangement, and each of the light-emitting units can emit light so that the light-emitting device can satisfy the display demand of the display apparatus; and the light-transmitting device is provided over the light-emitting device, and comprises a plurality of light-transmitting units that form a matrix arrangement and are provided corresponding to the light-emitting units, each of the light-transmitting units is of a rectangle shape, and comprises a light-transmitting opening that is formed by enclosing of side walls that have an independent inflating passageway, and the side walls are configured to have a light refraction passageway.

Therefore, when a certain light-emitting unit has failed, for example the light-emitting unit does not emit light or has an abnormal light output amount, a high-refractive-index gas (for example inert gas) may be put into the side walls of the light-transmitting unit correspondingly provided over the light-emitting unit to configure the light refraction passageways of the side walls, so that the lights that are emitted by the other light-emitting units, which are normally emitting light, around the light-emitting unit, after being refracted by the side walls, in the direction perpendicular to the failed light-emitting unit, emit out from the area of the failed light-emitting unit, to achieve the purpose of compensating for the light output amount of the failed light-emitting unit. When applied in the process of manufacturing the display apparatus, the present disclosure can treat the failed light-emitting unit without dismantling the display apparatus, which improves the product yield of the display apparatus, and is simple and convenient. Moreover, when a light-emitting unit has failed in the process of the user using the display apparatus, the user can treat the failed light-emitting unit without dismantling the display apparatus, which has simple repairing and a low cost, and can greatly improve the user experience.

Particularly, when the light-emitting units are OLED pixel dots, the corresponding display apparatus is an OLED display screen. When an OLED pixel dot fails or decreases brightness during production or after long-time usage of the OLED display screen, the side walls of the light-transmitting unit that corresponds to the failed OLED pixel dot may be filled with an inert gas, so that the lights emitted by the normal OLED pixel dots around the failed OLED pixel dot are refracted, and in the direction perpendicular to the failed OLED pixel dot, emit out from the area of the failed OLED pixel dot, to compensate for the light output amount of the failed OLED pixel dot, to enable the OLED display screen to normally display.

The above method for compensating for a failed OLED pixel dot is simple to realize, and when it is applied to the manufacturing, an OLED screen that contains a failed OLED pixel dot found before leaving factory can be conveniently repaired without dismantling or replacing, which improves the production yield of electronic apparatus comprising the OLED screen. Moreover, when a user uses an electronic apparatus comprising the OLED screen, if long-time usage causes a pixel dot of the OLED screen to fail or decrease brightness, the above method for compensating for a failed OLED pixel dot may also be used, which is simple to implement, does not require dismantling or replacing, has a low cost, and greatly improves the user experience. Furthermore, the OLED display screen has a simple structure, and a relatively low manufacturing cost. Especially, the light-transmitting units may be a light guide film that covers the OLED pixel dots, which has a relatively small volume, and does not influence the volume of the OLED display screen, and the involved thin film process is mature and cheap, and is applicable to scale production.

FIGS. 1 and 3 show respectively a schematic sectional view of the display apparatus provided in the present embodiment, and FIG. 2 shows a schematic diagram of the light-transmitting device 20 of the present embodiment. The quantity of the light-emitting units 11 or the light-transmitting units 21 shown in FIGS. 1, 2 and 3 is merely illustrative, and is not intended to limit the quantities of the light-emitting units and the light-transmitting units comprised in the display apparatus of the present embodiment.

The Second Embodiment

In the present embodiment, there is further provided an electronic apparatus 4000, comprising any of the display apparatus provided in the first embodiment. The electronic apparatus 4000 may be a desktop computer, a notebook computer, a mobile phone, a tablet and a PDA, and may also be a smart wearable device such as a sports bracelet and a sports watch.

Figure 4:
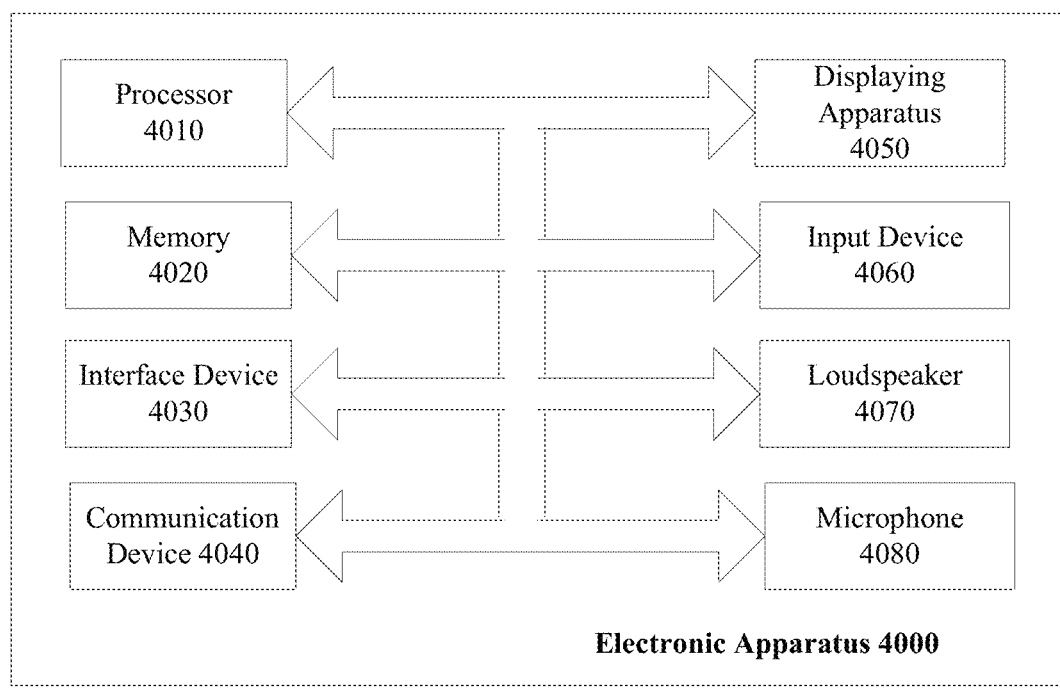
FIG. 4 shows a schematic block diagram of an electronic apparatus of the second embodiment of the present disclosure.

Particularly, as shown in FIG. 4, the electronic apparatus 4000 may comprise a processor 4010, a memory 4020, an interface device 4030, a communication device 4040, a display apparatus 4050, an input device 4060, a loudspeaker 4070, a microphone 4080, and so on. Among them, the processor 4010 may be a central processing unit CPU, a microprocessing unit MCU and so on. The memory 4020 comprises for example a ROM (read-only memory), a RAM (random access memory), a nonvolatile memory such as a hard disk and so on. The interface device 4030 comprises for example a USB interface, an earphone interface and so on. The communication device 4040 is capable of for example wired or wireless communication. The display apparatus 4050 is any of the display apparatus provided in the first embodiment. The input device 4060 may comprise for example a touch screen, a keyboard and so on. A user may input/output voice information by using the loudspeaker 4070 and the microphone 4080.

The configuration of electronic apparatus 4000 shown in FIG. 4 is merely explanatory, and is not intended to limit the present disclosure and its application or use. When applied to the embodiments of the present disclosure, the memory 4020 of the electronic apparatus 4000 is used to store instructions, and the instructions are used to control the processor 4010 to operate to execute any of the methods for treating failure of a light-emitting unit provided in the following third embodiment. A person skilled in the art should understand that, although FIG. 4 shows a plurality of devices of the electronic apparatus 4000, the present disclosure may merely involve part of the devices of them; for example, the electronic apparatus 4000 merely involves the processor 4010, the memory 4020 and the display apparatus 4050. A person skilled in the art can design the instructions according to the solution disclosed by the present disclosure. How the instructions control the processor to operate is well known in the art, and is not described in detail here.

The Third Embodiment

Figure 5:
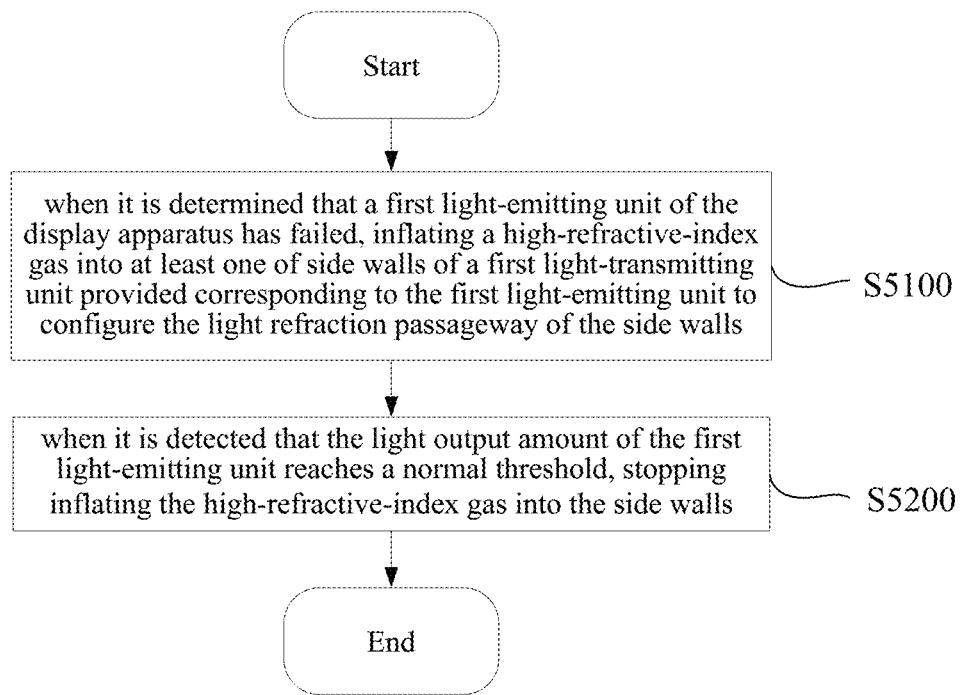
FIG. 5 shows a flow chart of a method for treating failure of a light-emitting unit of the third embodiment of the present disclosure.

The present embodiment further provides a method for treating failure of a light-emitting unit, applied to any of the display apparatus provided in the first embodiment, which is not discussed here further. The method for treating failure of a light-emitting unit, as shown in FIG. 5, comprises:

Step S5100, when it is determined that a first light-emitting unit of the display apparatus has failed, inflating a high-refractive-index gas into at least one of side walls of a first light-transmitting unit provided corresponding to the first light-emitting unit to configure the light refraction passageway of the side walls, so that a light emitted by a second light-emitting unit that neighbors the first light-emitting unit and normally emits light passes through the light refraction passageway, is refracted, and emits out from an area corresponding to the first light-emitting unit in a direction perpendicular to the first light-emitting unit.

The light-emitting device in the display apparatus comprises a plurality of light-emitting units that form a matrix arrangement. When the display apparatus is normally working, each of the light-emitting units can normally emit light. When a light-emitting unit has failed, it appears abnormal light emitting or insufficient light output amount. After it is determined that a certain light-emitting unit, for example the first light-emitting unit, has failed, by inflating a high-refractive-index gas such as an inert gas into at least one of side walls of a first light-transmitting unit provided corresponding to the first light-emitting unit, the light refraction passageway of the side walls can be configured, so that a light emitted by a second light-emitting unit that neighbors the first light-emitting unit and normally emits light passes through the light refraction passageway, is refracted, and emits out from an area corresponding to the first light-emitting unit in a direction perpendicular to the first light-emitting unit, to compensate for the light output amount of the first light-emitting unit.

Figure 6:
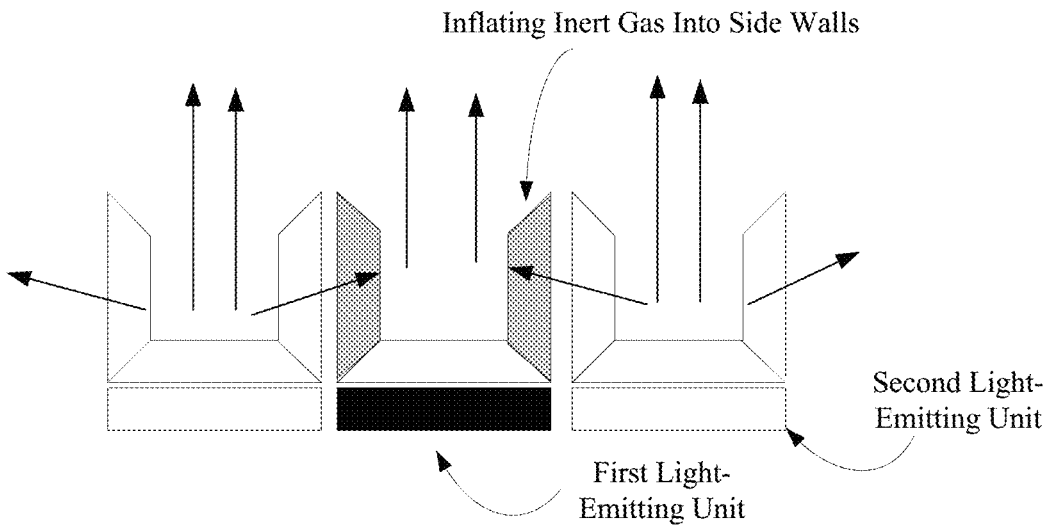
FIG. 6 shows an exemplary schematic diagram of a method for treating failure of a light-emitting unit of the third embodiment of the present disclosure.

In a particular example, as shown in FIG. 6 (the figure shows the sectional view of the light-emitting units and the light-transmitting units), all of the four side walls of the shown light-emitting unit are a trapezoid gas tank. After it is determined that the first light-emitting unit has failed, the four side walls of the light-emitting unit may be filled with an inert gas, wherein the inert gas may be sealedly stored in the display apparatus. The trapezoid gas tank is provided with at least one inflating opening that can be controlled to open and close, and when the first light-emitting unit is compensated for the light output amount, the inflating opening is controlled to open, or, the inert gas may flow into the gas tank after flowing into an inlet of the display apparatus that communicates with the exterior. After the inert gas is put into the four side walls of the first light-emitting unit (FIG. 6 merely shows the cross section of two side walls), the lights emitted by eight second light-emitting units around the first light-emitting unit can pass through the light refraction passageway of the corresponding side walls, so that a light emitted by a second light-emitting unit that neighbors the first light-emitting unit and normally emits light passes through the light refraction passageway, is refracted, and emits out from an area corresponding to the first light-emitting unit in a direction perpendicular to the first light-emitting unit, to more efficiently compensate for the light output amount of the first light-emitting unit.

In the present embodiment, the light output amount of each of the light-emitting units can be obtained by driving the light-emitting devices of the display apparatus to emit light, and then photographing an image of the display apparatus by using for example an external high-resolution camera and processing. For example, when the light-emitting units are OLED pixel dots, the brightness values of the OLED pixel dots can be obtained. When it is found that the light output amount of a certain light-emitting unit is obviously less than the light output amount of the light-emitting units around it or less than a preset normal threshold, the light-emitting unit can be determined as failure. Therefore, the method for treating failure of a light-emitting unit of the present embodiment further comprises a step of determining the failure of the first light-emitting unit by acquiring light output amount of each of the light-emitting units of the display apparatus.

After Step S5100 starts to compensate for the light output amount of the first light-emitting unit, the process enters Step S5200, which is, when it is detected that a light output amount of the first light-emitting unit reaches a normal threshold, stopping inflating the high-refractive-index gas into the side walls, wherein the normal threshold is determined according to a light output amount of the second light-emitting unit.

In the present embodiment, the normal threshold is determined according to a light output amount of the second light-emitting unit. Particularly, the normal threshold may be the weighted average of the light output amounts of the second light-emitting units that are involved in the compensating for the light output amount of the first light-emitting unit. For example, all of the four side walls of the first light-emitting unit are filled with an inert gas, so that the lights emitted by eight second light-emitting units around the first light-emitting unit are refracted by the side walls of the first light-emitting unit to compensate for the light output amount of the first light-emitting unit. Assuming that the light output amounts of the second light-emitting units are individually $X_i$ (i=1 . . . , 8), the normal threshold $X_{th}$ is calculated according to the formula 1:

$$X_{th} = \frac{\sum_{i=1}^{i=8} \alpha_i \times X_i}{8} \quad \text{(formula 1)}$$

wherein $\alpha_i$ are the corresponding weighting coefficients, and may be acquired according to the experience in engineering, and in an example, $\alpha_i=1$ (i=1, . . . , 8).

In the present embodiment, the light output amount (or brightness value) of each of the light-emitting units may be obtained in the process of implementing Step S5100 by in real time monitoring and photographing by using an external high-resolution camera to acquire the light output amount of the display apparatus, for example acquiring the images of the display apparatus with a proper frequency (interval period), and using an image processing method. When it is detected that the light output amount of the first light-emitting unit reaches a normal threshold, the inflating the high-refractive-index gas into the side walls of the first light-emitting unit may be stopped.

The above method for treating failure of a light-emitting unit provided in the present embodiment can, when a light-emitting unit of the display apparatus provided in the first embodiment has failed, put a high-refractive-index gas into the side walls of the light-transmitting unit corresponding to the failed light-emitting unit, so that the lights emitted by the normal light-emitting units around the failed light-emitting unit are refracted by the side walls, and emit out from the area corresponding to the failed light-emitting unit, to compensate for the light output amount of the failed light-emitting unit, to realize the repairing on the failed light-emitting unit. The present disclosure does not need to dismantle the display apparatus, and has simple and convenient operation. When applied in the process of producing and manufacturing the display apparatus, the present disclosure can effectively improve the production yield of the display apparatus. When a light-emitting unit has failed in the process of the user using the display apparatus, the repairing is simple and low cost, which improves the user experience. The present disclosure is particularly applicable to failed OLED pixel dots when the display apparatus is an OLED screen.

Figure 7:
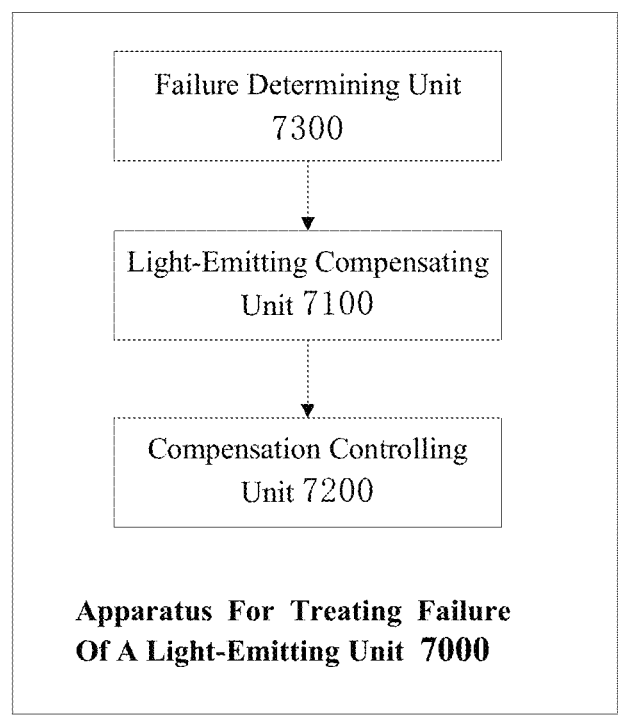
FIG. 7 shows a schematic block diagram of an apparatus for treating failure of a light-emitting unit of the third embodiment of the present disclosure.

In the present embodiment, there is further provided an apparatus 7000 for treating failure of a light-emitting unit, as shown in FIG. 7, comprising a light-emitting compensating unit 700 and a compensation controlling unit 7200, and in some embodiments, further comprising a failure determining unit 7300, for implementing the method for treating failure of a light-emitting unit provided in the present embodiment, which is not discussed here further.

The apparatus 7000 for treating failure of a light-emitting unit comprises:

a light-emitting compensating unit 7100, for, when it is determined that a first light-emitting unit of the display apparatus has failed, inflating a high-refractive-index gas into at least one of side walls of a first light-transmitting unit provided corresponding to the first light-emitting unit to configure the light refraction passageway of the side walls, so that a light emitted by a second light-emitting unit that neighbors the first light-emitting unit and normally emits light passes through the light refraction passageway, is refracted, and emits out from an area corresponding to the first light-emitting unit in a direction perpendicular to the first light-emitting unit; and a compensation controlling unit 7200, for, when it is detected that a light output amount of the first light-emitting unit reaches a normal threshold, stopping inflating the high-refractive-index gas into the side walls, wherein the normal threshold is determined according to a light output amount of the second light-emitting unit.

In a particular example, the display apparatus sealedly stores a high-refractive-index gas, each of the side walls of the light-transmitting unit is a gas tank that has at least one inflating opening, and the inflating opening can be controlled to open or close. The light-emitting compensating unit 7100 may be a solenoid valve controlling circuit that can cause the high-refractive-index gas, for example an inert gas, sealedly stored in the display apparatus to be put into the gas tank, wherein the solenoid valve controlling circuit may be built in the display apparatus. The compensation controlling unit 7200 may be a microprocessing unit MCU, and when it is detected that the light output amount of the first light-emitting unit reaches a normal threshold, controls the inflating opening to close, to stop inflating the high-refractive-index gas into the side walls.

In some embodiments, the apparatus 7000 for treating failure of a light-emitting unit may further comprise a failure determining unit 7300, for determining the failure of the first light-emitting unit by acquiring light output amount of each of the light-emitting units of the display apparatus.

Particularly, the failure determining unit 7300 may be implemented together by part or all of the functional modules of the microprocessing unit MCU and the high-resolution camera that has an interface with the microprocessing unit MCU and is external to the display apparatus.

The embodiments of the present disclosure have been described above by referring to the drawings. The method and apparatus provided by the present embodiment can, when a light-emitting unit of the display apparatus provided in the first embodiment has failed, put a high-refractive-index gas into the side walls of the light-transmitting unit corresponding to the failed light-emitting unit, so that the lights emitted by the normal light-emitting units around the failed light-emitting unit are refracted by the side walls, and emit out from the area corresponding to the failed light-emitting unit, to compensate for the light output amount of the failed light-emitting unit, to realize the repairing on the failed light-emitting unit. The present disclosure does not need to dismantle the display apparatus, and has simple and convenient operation. When applied in the process of producing and manufacturing the display apparatus, the present disclosure can effectively improve the production yield of the display apparatus. When a light-emitting unit has failed in the process of the user using the display apparatus, the repairing is simple and low cost, which can effectively improve the user experience. The present disclosure is particularly applicable to failed OLED pixel dots when the display apparatus is an OLED screen.

A person skilled in the art should understand that, the apparatus 7000 for treating failure of a light-emitting unit may be implemented by various modes. For example, the apparatus 7000 for treating failure of a light-emitting unit may be implemented by configuring a processor by using instructions. For example, in some embodiments, the instructions are stored in an ROM, and when the apparatus is started up, the instructions are read from the ROM to a programmable device to implement the apparatus 7000 for treating failure of a light-emitting unit. For example, the apparatus 7000 for treating failure of a light-emitting unit may be incorporated into a dedicated device (for example an ASIC). The apparatus 7000 for treating failure of a light-emitting unit may be implemented by being separated into mutually independent units, or be implemented integratedly. The apparatus 7000 for treating failure of a light-emitting unit may be implemented by using one of the above implementing modes, or may be implemented by using the combination of two or more of the above implementing modes.

A person skilled in the art well knows that, along with the development of electronic information technique such as large scale integrated circuit technique and the tendency of hard software, it has become relatively difficult to clearly define the boundary of software and hardware of computer systems, because any operation may be implemented by software and may also be implemented by hardware. The execution of any instruction may be completed by hardware, and may also be completed by software. Regarding a certain machine function, whether a hardware implementation solution or a software implementation solution is employed depends on nontechnical factors such as cost, speed, reliability, storage capacity and variation period. Therefore, for a person skilled in the art of electronic information, the mode that more directly and clearly describes a technical solution is to describe each of the operations of the solution. When the operations to be executed are known, a person skilled in the art can directly design the desired product on the basis of the considerations on the nontechnical factors.

The present disclosure may be implemented as a system, a method and/or a computer program product. The computer program product may comprise a computer readable storage medium having a computer readable program instruction thereon for causing a processor to carry out the aspects of the present disclosure.

The computer readable storage medium may be a tangible device that can retain and store an instruction for use by an instruction execution device. The computer readable storage medium may be, for example, but is not limited to, an electronic storage device, a magnetic storage device, an optical storage device, an electromagnetic storage device, a semiconductor storage device, or any suitable combination thereof. A non-exhaustive list of more specific examples of the computer readable storage medium includes: a portable computer diskette, a hard disk, a random access memory (RAM), a read-only memory (ROM), an erasable programmable read-only memory (EPROM or flash memory), a static random access memory (SRAM), a portable compact disc read-only memory (CD-ROM), a digital versatile disk (DVD), a memory stick, a floppy disk, a mechanically encoded device such as punch-cards or raised structures in a groove having an instruction recorded thereon, and any suitable combination thereof. A computer readable storage medium, as used herein, is not to be construed as being a transitory signal per se, such as a radio wave or other freely propagating electromagnetic waves, an electromagnetic wave propagating through a waveguide or other transmission media (for example, a light pulse passing through a fiber-optic cable), or an electrical signal transmitted through a wire.

The computer readable program instruction described herein may be downloaded to respective computing/processing devices from a computer readable storage medium or to an external computer or external storage device via a network, for example, the Internet, a local area network, a wide area network and/or a wireless network. The network may comprise copper transmission cables, optical fiber transmission, wireless transmission, routers, firewalls, switches, gateway computers and/or edge servers. A network adapter card or network interface in each computing/processing device receives the computer readable program instructions from the network and forwards the computer readable program instructions for storage in a computer readable storage medium within the respective computing/processing device.

The computer readable program instructions for carrying out the operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer, or entirely on a remote computer or server. In the scenario that involves a remote computer, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform the aspects of the present disclosure.

Various aspects of the present disclosure are described in reference with the flow chart and/or block diagram of the method, apparatus (system) and computer program product according to the embodiments of the present disclosure. It should be understood that each block in the flow chart and/or block diagram and any combinations of the blocks in the flow chart and/or block diagram may be implemented by the computer readable program instructions.

These computer readable program instructions may be provided to a processor of a general purpose computer, special purpose computer, or other programmable data processing device to produce a machine, such that the instructions, which execute via the processor of the computer or other programmable data processing device, create a means for implementing the functions/acts specified in the flowchart and/or block diagram block or blocks. These computer readable program instructions may also be stored in a computer readable storage medium that can direct a computer, a programmable data processing device, and/or other devices to function in a particular manner, such that the computer readable storage medium having instructions stored therein comprises an article of manufacture including instructions which implement the aspects of the functions/acts specified in the flowchart and/or block diagram block or blocks.

The computer readable program instructions may also be loaded onto a computer, other programmable data processing device, or other device to cause a series of operational steps to be performed on the computer, other programmable data processing device, or other device to produce a computer implemented process, such that the instructions which execute on the computer, the other programmable data processing device, or the other device implement the functions/acts specified in the flowchart and/or block diagram block or blocks.

The accompanying flow chart and block diagram present possible architecture, functions and operations realized by the system, method and computer program product according to a plurality of embodiments of the present disclosure. At this point, each block in the flow chart or block diagram may represent a module, a program segment, or a portion of the instruction. The module, the program segment or the portion of the instruction includes one or more executable instructions for implementing specified logic functions. In some alternative implementations, the function indicated in the block may also occur in an order different from the one represented in the drawings. For example, two consecutive blocks actually may be executed substantially in parallel, and sometimes they may also be executed in a reverse order, depending on the involved functions. It should also be noted that each block in the block diagram and/or flow chart, and any combinations of the blocks in the block diagram and/or flow chart may be implemented by a dedicated hardware-based system for implementing specified functions or actions, or a combination of the dedicated hardware and the computer instructions. It is well known to those skilled in the art that the implementation by hardware, the implementation by software, and the implementation by a combination of software and hardware are equivalent.

Various embodiments of the present disclosure have been described above, and the above explanation is illustrative rather than exhaustive and is not limited to the disclosed embodiments. Without departing from the scope and spirit of each explained embodiment, many alterations and modifications are obvious for those skilled in the art. The selection of the terms in the text aims to best explain the principle, actual application or technical improvement in the market of each embodiment or make each embodiment disclosed in the text comprehensible for those skilled in the art. The protection scope of the present disclosure should be determined by the appended claims.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment, it being understood that various changes may be made in the function and arrangement of elements described in an exemplary embodiment without departing from the scope of the invention as set forth in the appended claims and their legal equivalents.

What is claimed is:

1. A display apparatus, wherein the display apparatus comprises:
    a light-emitting device (10), wherein the light-emitting device (10) comprises a plurality of light-emitting units (11) that form a matrix arrangement; and
    a light-transmitting device (20) provided over the light-emitting device (10), wherein the light-transmitting device (20) comprises a plurality of light-transmitting units (21) that form a matrix arrangement and are provided corresponding to the light-emitting units (11), each of the light-transmitting units (21) is of a rectangle shape, and comprises a light-transmitting opening (212) that is formed by enclosing of side walls (213) that have an independent inflating passageway (215), and the side walls (213) are configured to have a light refraction passageway (214).

2. The display apparatus according to claim 1, wherein the light-emitting units (11) are OLED pixel dots.

3. The display apparatus according to claim 1, wherein each of the side walls (213) is a gas tank provided with at least one inflating opening (216).

4. The display apparatus according to claim 1, wherein a cross section of the side walls (213) is of a trapezoid or arch shape.

5. The display apparatus according to claim 1, wherein the light-transmitting units (21) are a light guide film that covers the light-emitting units (11).

6. A method for treating failure of a light-emitting unit, wherein the method is applied to the display apparatus according to claim 1, and the method comprises:
    when it is determined that a first light-emitting unit of the display apparatus has failed, inflating a high-refractive-index gas into at least one of side walls of a first light-transmitting unit provided corresponding to the first light-emitting unit to configure the light refraction passageway of the side walls, so that a light emitted by a second light-emitting unit that neighbors the first light-emitting unit and normally emits light passes through the light refraction passageway, is refracted, and emits out from an area corresponding to the first light-emitting unit in a direction perpendicular to the first light-emitting unit; and
    when it is detected that a light output amount of the first light-emitting unit reaches a normal threshold, stopping inflating the high-refractive-index gas into the side walls, wherein the normal threshold is determined according to a light output amount of the second light-emitting unit.

7. The method for treating failure of a light-emitting unit according to claim 6, wherein the method further comprises:
    a step of determining the failure of the first light-emitting unit by acquiring light output amount of each of the light-emitting units of the display apparatus.

8. An electronic apparatus, wherein the electronic apparatus comprises a display apparatus, wherein the display apparatus comprises:
    a light-emitting device (10), wherein the light-emitting device (10) comprises a plurality of light-emitting units (11) that form a matrix arrangement; and
    a light-transmitting device (20) provided over the light-emitting device (10), wherein the light-transmitting device (20) comprises a plurality of light-transmitting units (21) that form a matrix arrangement and are provided corresponding to the light-emitting units (11), each of the light-transmitting units (21) is of a rectangle shape, and comprises a light-transmitting opening (212) that is formed by enclosing of side walls (213) that have an independent inflating passageway (215), and the side walls (213) are configured to have a light refraction passageway (214).

9. The electronic apparatus according to claim 8, wherein the light-emitting units (11) are OLED pixel dots.

10. The electronic apparatus according to claim 8, wherein each of the side walls (213) is a gas tank provided with at least one inflating opening (216).

11. The electronic apparatus according to claim 8, wherein a cross section of the side walls (213) is of a trapezoid or arch shape.

12. The electronic apparatus according to claim 8, wherein the light-transmitting units (21) are a light guide film that covers the light-emitting units (11).

* * * * *